United States Patent [19]
Penny et al.

[11] Patent Number: 6,023,181
[45] Date of Patent: Feb. 8, 2000

[54] HIGH SPEED UNITRANSITION INPUT BUFFER

[75] Inventors: Daniel B. Penny; Steven C. Eplett, both of Houston, Tex.

[73] Assignee: Texas Instruments Incorporated, Dallas, Tex.

[21] Appl. No.: 09/039,012

[22] Filed: Mar. 13, 1998

Related U.S. Application Data

[60] Provisional application No. 60/044,914, Apr. 25, 1997.
[51] Int. Cl.[7] ........................................................ G06F 1/04
[52] U.S. Cl. ............................ 327/291; 327/299; 327/176
[58] Field of Search ..................................... 327/295, 294, 327/291, 299, 172, 173, 174–175, 312, 313, 323, 324, 26–27; 326/82, 83, 87; 365/189.06

[56] References Cited

U.S. PATENT DOCUMENTS 5,477,180  12/1995  Chen ........................................ 327/175
5,828,249  10/1998  Sessions .................................. 327/115

*Primary Examiner*—Tuan T. Lam
*Attorney, Agent, or Firm*—Frank D. A. Cimino; Robby T. Holland; Richard L. Donaldson

[57] ABSTRACT

A two stage input buffer substantially reduces propagation delay by triggering only off of the rising edge of the external clock signal, eliminating a pulse generator, and setting the pulse width via feedback through a fixed delay. An unbalanced driver reduces capacitance on the N-channel transistor. In a memory application, such as in a synchronous dynamic random access memory, access time is improved, margin is advantageously added to the hold time requirement, and driver fan out capabilities are improved.

40 Claims, 3 Drawing Sheets

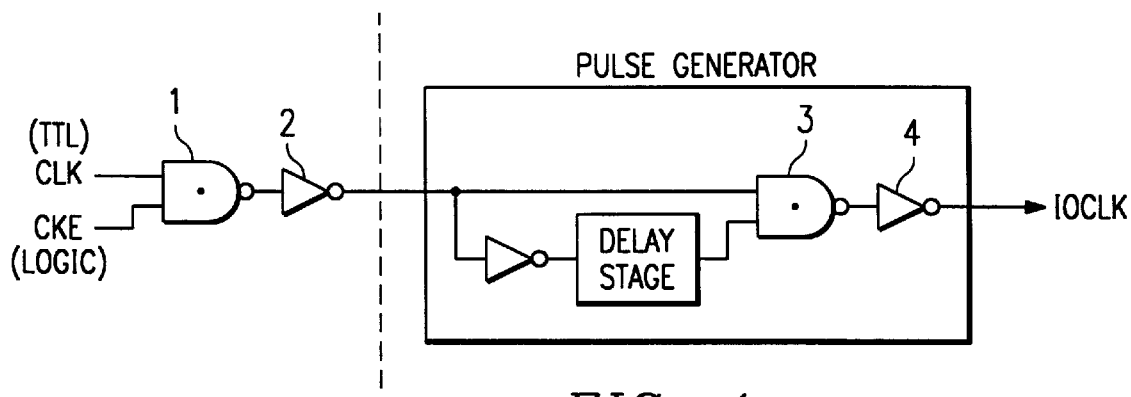
FIG. 1
(PRIOR ART)
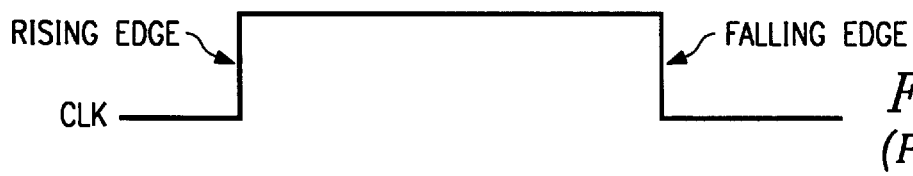
FIG. 2A
(PRIOR ART)
FIG. 2B
(PRIOR ART)
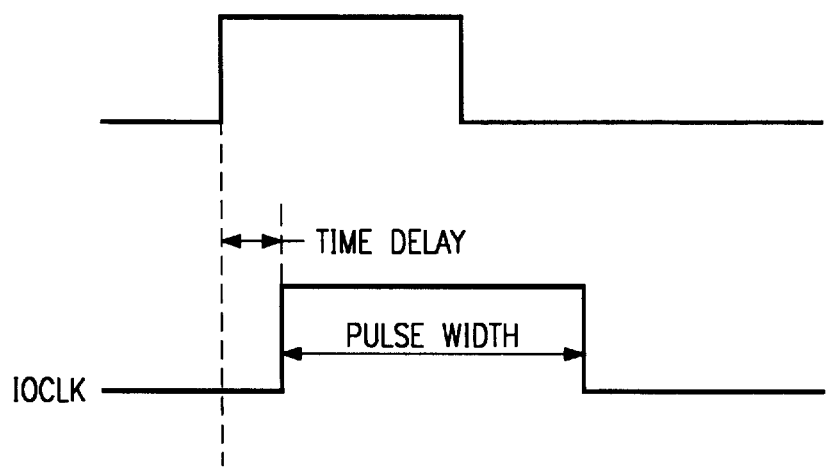
FIG. 2C
(PRIOR ART)

HIGH SPEED UNITRANSITION INPUT BUFFER

This is a Non Provisional application filed under 35 USC 119(e) and claims priority of prior provisional, Ser. No. 60/044,914 of inventor Penny, et al., filed Apr. 25, 1997.

FIELD OF INVENTION

This invention is generally in the field of integrated circuits and relates more specifically to input buffer circuits.

BACKGROUND OF INVENTION

Present complementary metal oxide semiconductor (CMOS) circuits are frequently used for a variety of computer applications. Among the many uses, CMOS circuits are used in memory devices. Among memory devices, two frequently types are dynamic random access memories (DRAMs) and synchronous dynamic random access memories (SDRAMs). Unlike typical DRAMs which use internal timing signals generated from the standard row address strobe (RAS) and column address strobe (CAS) signals issued by the microprocessor, SDRAMs use internal timing signals generated from the external system clock which is the same clock the microprocessor uses. Hence, SDRAMs may operate at a much higher speed than DRAMs. U.S. Pat No. 5,386,385, issued Jan. 31, 1995, entitled "Method and Apparatus for Preventing Invalid Operating Modes and an Application To Synchronous Memory Devices", assigned to Texas Instruments Incorporated, discloses a SDRAM.

Input buffers in semiconductors act as an interface between external input signals and internal logic circuits. Input buffer designs, as disclosed in FIGS. 126, 138 and 139 of U.S. Pat No. 5,208,776, issued Mar. 02, 1993, entitled "Pulse Generation Circuit", assigned to Texas Instruments Incorporated, translate external transistor logic (TTL) voltage levels to internal logic levels. Typically, TTL levels are 0 volts for a "low" and 5 volts for a "high". Present semiconductor memories have internal operating voltages of 0 volts for a "low" and 3.3 volts for a "high"; internal operating voltages will continue to drop as operating power specifications shrink. The following United States patents, also assigned to Texas Instruments Incorporated, illustrate input buffers designs:

| | | |
|---|---|---|
| 5,612,635 | Issued 03/18/97 | High Noise-Margin TTL Buffer Circuit... |
| 5,455,532 | Issued 10/03/95 | 3V To 5V Receiver/Translator Using a 5V Supply... |
| 5,440,248 | Issued 08/08/95 | Power-Saver Differential Input Buffer |
| 5,347,184 | Issued 09/13/94 | Dual Receiver Edge-Triggered Digital Signal... |
| 5,324,999 | Issued 06/28/94 | Input Buffer with Compensated Low-Pass... |
| 5,291,078 | Issued 03/01/94 | Gate Circuits In Transition Detection Input Buffers |
| 5,289,430 | Issued 02/22/94 | Self Latching Input Buffer |
| 5,194,767 | Issued 03/16/93 | TTL Compatible Hysteresis Input Buffer... |
| 5,034,623 | Issued 07/23/91 | Low Power TTL Level CMOS Input Buffer... |

Referring now to prior art FIG. 1, a four stage input buffer is illustrated. The input buffer and pulse generator is illustrative of the type used in the past designs such as the 2 meg X 8 SDRAM manufactured by Texas Instruments Incorporated. Signal CLK is the external system clock, which may be, for illustrative purposes, typically around 66 megahertz. It is a LVTTL signal with logic defined at 2.0 volts and logic defined at 0.8 volts. System clocks are increasing in speed each year. Signal CKE_ is a input buffer enable signal. It operates on logic voltage levels of 0 or 3.3 volts Signal IOCLK is the output clock generated by the circuit of FIG. 1. It operates logic voltage levels of 0 or 3.3 volts.

In operation, the CLK signal and CKE_ signal are input to a NAND gate 1 (stage one) which generates a signal which is input to an invertor 2 (stage two). Ideally, the output signal IOCLK would track the external clock signal CLK. However, the external clock could have a bad duty cycle; ie., one in which the high time and low time would not be equal. It could have a long high time and a short low time or vice versa. Prior art FIGS. 2a and 2b illustrate various "bad" CLK signals of varying pulse width with FIG. 2a illustrating a long high time and FIG. 2b illustrating a short high time. Internally, the SDRAM clock IOCLK needs to be constant, as illustrated in FIG. 2c, regardless of the duty cycle of the external clock. To accomplish this, the output of invertor 2 is fed into a pulse generator forming stages 3 and 4 of the prior art FIG. 1 circuit. The pulse generator includes a delay stage and a NAND gate 3 and an invertor 4. As is known by those of ordinary skill in the art, the "speed path" of the prior art circuit of FIG. 1 is thus NAND gate 1, invertor 2, NAND gate 3 and invertor 4. The pulse generator triggers off of the rising edge of CLK and generates a rising pulse every time CLK rises. The goal is to track the rising edge of the input system CLK and have a consistent pulse width IOCLK regardless of the falling edge of the input system clock signal.

A problem, however, with the four stage approach is that a propagation delay exist which is associated with each stage. Because of the propagation delay, the rising edge of IOCLK will not occur simultaneously with CLK; an unfortunate time lag exists as illustrated in prior art FIG. 2c. The time lag affects two critical parameters of the SDRAM known as access time and hold time. Access time is the amount of time it takes to access data in the memory array. A shorter access time is desirable. Hold time affects the other inputs to the SDRAM, such as addresses and control signals, which are latched by the rising edge of IOCLK. These signals must be held by the user a certain amount time after the rising edge of IOCLK to make sure they are properly received or caught. The quicker the rising edge of IOCLK is generated, the sooner the hold time may begin. If the time before beginning hold time is shortened, more margin is added to the overall specification. Currently, the hold time specification is around 1 nanosecond and is very difficult to meet; a lot of manufactured SDRAMs fail the test and manufacturing yield is lost.

It is accordingly an object of the invention to reduce the access time in memory devices.

It also an object of the invention to reduce the time before beginning the hold time.

Other objects and advantages of the invention will be apparent to those of ordinary side in the art having reference to the following specification and drawings.

SUMMARY OF THE INVENTION

A high speed input buffer relies only the input rising edge of the external clock signal to generate an internal clock signal having a uniform pulse width regardless of the duty cycle of the external clock signal. The circuit's speed path has only two stages to reduce delay from sensing the rising edge of the external clock signal to generating the rising edge of the internal clock signal. A tri-statable driver initially senses the external clock signal and drives an unbalanced P-N driver whose P-channel transistor is large in comparison to its N-channel transistor and thus generates the rising edge of the internal clock. Feedback from the internal clock into a fixed delay stage, which also drives the unbalanced driver, terminates the internal clock signal and thus provides the uniform pulse width Since the driver is unbalanced, the capacitive load on the first stage is reduced and its fan out drive and switching speed are greatly improved.

BRIEF DESCRIPTION OF THE DRAWINGS

FIG. 1 is a prior art drawing illustrating a four stage input buffer clock generator circuit.

FIGS. 2a and 2b are prior art drawings illustrating input clock CLK signals of varying pulse width; FIG. 2a depicts a long pulse width and FIG. 2b depicts a short pulse width.

FIG. 2c is a drawing illustrating output signal IOCLK of uniform pulse width.

DETAILED DESCRIPTION OF PREFERRED EMBODIMENT

Figure 3:
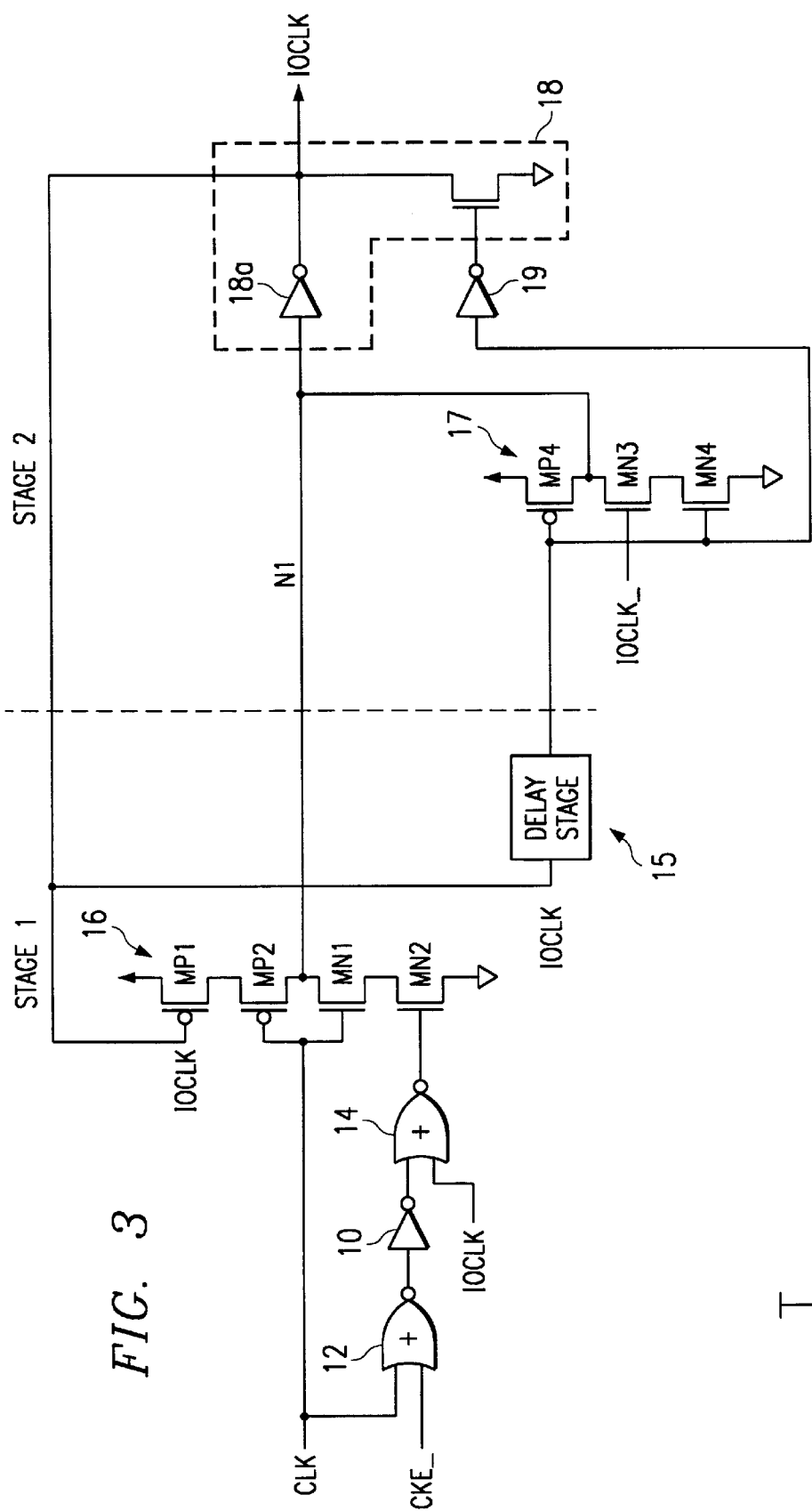
FIG. 3 is a drawing illustrating an input buffer circuit according to a preferred embodiment of the invention.
Figure 3A:
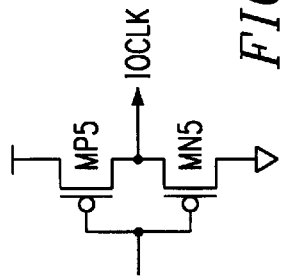
FIG. 3a is a transistor level drawing of inverter 18a according to a preferred embodiment of the invention.
Figure 4:
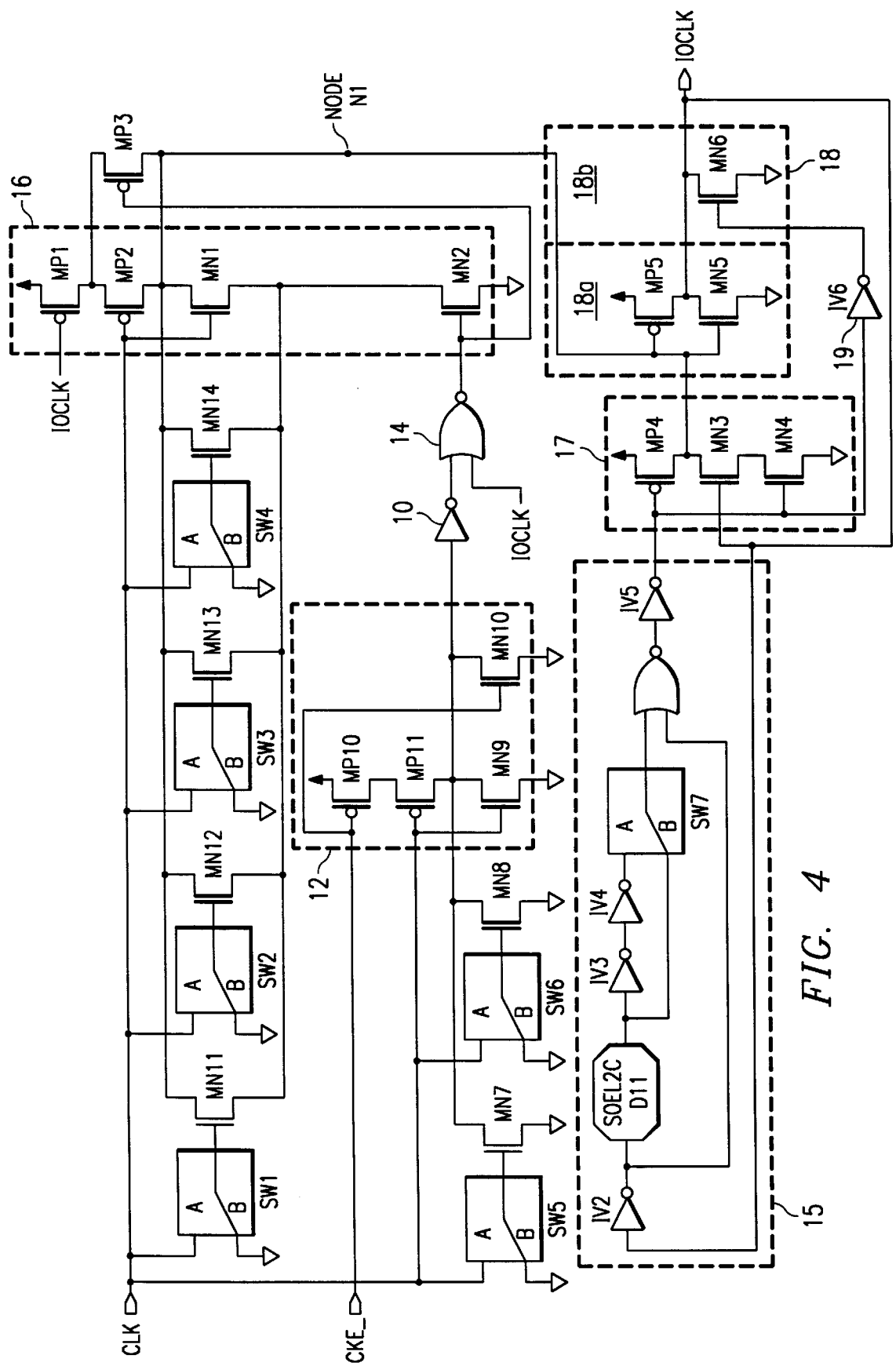
FIG. 4 is an electrical schematic of FIG. 3.

Referring now to FIG. 3, a high speed input buffer circuit according a preferred embodiment of the invention is illustrated which uses a speed path of two components versus the prior art speed path of four components. FIG. 4 is an electrical schematic of FIG. 3. FIGS. 3 and 4 have corresponding reference numerals and the clock signals have corresponding names as in FIGS. 1 and 2.

In stage 1 of FIG. 3, the external clock enable signal CKE_ feeds into a NOR gate 12 that is coupled to an invertor 10 which is coupled to one input of a NOR gate 14. Also, in feedback arrangement, the output clock signal IOCLK is fed into the NOR gate 14. The NOR gate 14 drives a N-channel transistor MN2 of a tri-state driver 16. Tri-state driver 16 is different than NAND gate 1 of prior art FIG. 1. IOCLK is additionally fed back into a P-channel transistor MP1 of tri-state driver 16. The external system clock signal CLK drives the tri-state driver 16 and NOR gate 12.

In stage 2 of FIG. 3, IOCLK drives a delay stage 15 that feeds into a P-channel transistor MP4 of a series connected transistor chain 17. The series chain 17 is different than NAND gate 3 of prior art FIG. 1. The output of tri-state driver 16 and the output of transistor chain 17 are coupled at a node N1 and are input into the output driver 18. Output driver 18 includes an unbalanced P-N invertor 18a in which the P-channel transistor MP5 is larger than the N-channel transistor MN5. This provides advantages which will be explained below.

In operation of FIG. 3, when the system clock CLK rising edge comes in, the tri-statable driver 16 is on, node N1 goes low, and output clock IOCLK goes high. The length of time IOCLK remains high (the pulse width) is determined by the circuit independent of the pulse width of the system clock CLK. IOCLK high is fed into the P-channel transistor MP1 of tri-statable driver 16 and turns it off. This initially drives node N1 low where it needs to be held. Holding node N1 low is accomplished by the series connected transistors 17 as its two N-channel transistors MN3 and MN4 turn on in response to IOCLK_ and thus hold node N1 low. During this time, IOCLK is fed into delay stage 15 which effectively sets the desired width of the pulse of IOCLK. The rising edge of IOCLK gets the delay stage started. After the rising edge propagates through delay stage 15, it turns on the P-channel transistor MP4 chain 17 and turns off the N-channel transistor MN4. This forces node N1 high. Simultaneous with forcing node N1 high, inverter 19 fires the N-channel transistor MN6 of the output driver 18b low. This makes IOCLK fall low, thus setting its pulse width.

This circuit eliminates 2 stages over the prior art circuit. The second stage sized for fast switching of the rising edge. Thus, about 1.0 nanosecond of propagation delay is eliminated; IOCLK occurs about 1.0 nanosecond sooner than in the prior art. Access time improvement is greater than 0.5 nanoseconds, around 8% of the specification. A faster IOCLK also allows faster latching of clocked inputs (such as addresses), improving the input hold time requirement by greater than 50% (the specification is currently 1 nanosecond.

In FIG. 4, the unbalanced P-N driver 18a of output driver 18 is not balanced because the P channel MP5 is extremely strong as compared to the N-channel MN5; its transistor width to length ratio is large compared to the N-channel. A balanced driver may be on the order of 250 width for the P-Channel and 125 width for the N-channel. In the preferred embodiment, P-channel transistor MP5 has a width of 400 versus a width of 20 in N-channel transistor MN5. Of course, the widths of the P and N transistors for unbalancing are highly dependent upon the specifics of semiconductor manufacturing process. Having the unbalanced P-N driver with the large P-channel transistor advantageously allows the tri-statable driver 16 to drive a large P-channel and a small N-channel rather than a large P-channel and a large N-channel which would have a lot of capacitance. Reducing the amount of capacitance on the drive is important because it improves the fan-out ratio of the driver. IOCLK can drive more inputs because of the smaller capacitance on the driver 18. In an SDRAM IOCLK drives all the other input buffers for the address and control circuitry.

In FIG. 4, switches SW1–SW7 are metal level switches (typically placed into the top level of metal) which exist for setting a stable trip point for variances in semiconductor processes. The trip point for the input buffer circuit should be about should be about the midpoint of the input voltage range. In this case, the trip point should be about 1.4 volts. Box d11 represents adjustable resistor capacitor RC delay circuit. It consists of series connected invertors with a capacitor between the output of one invertor and the input of another invertor.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An input buffer, comprising:
   a controllable input stage connected to receive an external input signal, the controllable input stage operable to sense the rising edge of the external input signal and generate an output signal at an output of the controllable input stage in response thereto;
   a driver circuit having an input and an output, the input of the driver circuit coupled to the output of the controllable input stage, the driver circuit generating a rising edge of an internal signal at its output in response to the output signal of the controllable input stage generated in response to the rising edge of the external input signal; and a delay circuit coupled to the driver circuit, the delay circuit receiving the rising edge of the internal signal, and generating a signal that causes the driver circuit to generate a falling edge of the internal signal independent of the falling edge of the external input signal.

2. The input buffer of claim 1 wherein the driver circuit comprises a P-channel transistor having a first width and an N-channel transistor having a second width, and wherein the first width is significantly greater than two times the second width.

3. The driver circuit of claim 2, wherein the first width is about 20 times second width.

4. The input buffer of claim 1, wherein the driver circuit is unbalanced.

5. The input buffer of claim 1, wherein the controllable input stage comprises a tristate circuit and the tristate circuit is tristated by an enable signal.

6. The input buffer of claim 5, wherein the enable signal is derived from the internal signal such that the tristate circuit is tristated in response to the rising edge of the internal signal.

7. The input buffer of claim 1, wherein the controllable input stage comprises a tristate circuit and the tristate circuit comprises:

a first P-channel transistor and a second P-channel transistor connected in series between a power supply terminal and the output of the tristate circuit, the gate of the first P-channel transistor is connected to receive an enable signal and the gate of the second P-channel transistor is connected to receive the external input signal;

a first N-channel transistor and a second N-channel transistor connected in series between the output of the tristate circuit and a reference voltage terminal, the gate of the first N-channel transistor is connected to receive the external input signal, and the gate of the second N-channel transistor is connected to receive the complement of the enable signal.

8. The input buffer of claim 7, wherein the enable signal is derived from the internal signal.

9. The input buffer of claim 1, wherein the driver circuit comprises an inverter.

10. The input buffer of claim 9, wherein the driver circuit further comprises a transistor having its source-drain path connected between the output terminal of the driver circuit and a reference terminal, and its gate coupled to the signal generated by the delay circuit.

11. The input buffer of claim 9, further comprising an additional circuit connected between a power supply terminal and the input of the driver circuit, the additional circuit placing a high voltage on the input of the driver circuit responsive to the signal generated by the delay circuit.

12. The input buffer of claim 1, wherein the delay circuit includes at least one adjustment mechanism to adjust the delay associated with the delay circuit.

13. The input buffer of claim 12, wherein the adjustment mechanism comprises metal level switches.

14. The input buffer of claim 12, wherein the adjustment mechanism comprises an adjustable resistor capacitor (RC) delay circuit.

15. The input buffer of claim 14, wherein the adjustable resistor capacitor (RC) delay circuit includes a chain of inverters and at least one capacitor.

16. The input buffer of claim 1, wherein the input buffer is a clock buffer of a synchronous dynamic random access memory (SDRAM) device.

17. An input buffer, comprising:

an input stage having a first input coupled to receive an external input signal, a second input coupled to receive an enable signal, and an output;

a driver circuit having an input coupled to the output of the input stage and an output on which an internal signal is generated, the driver circuit outputting a rising edge of the internal signal in response to a rising edge of the external input signal being input to the input stage;

a delay circuit having an input coupled to the output of the driver circuit, the delay circuit generating an output signal in response to the rising edge of the internal signal and applying the output signal to the driver circuit; and wherein the input stage is disabled by the enable signal after the rising edge of the internal signal is generated, and subsequently the output signal of the delay circuit causes the driver circuit to generate a falling edge of the internal signal.

18. The input buffer of claim 17 wherein the enable signal is derived from the internal signal.

19. The input buffer of claim 18, wherein the enable signal disables the input stage in response to the rising edge of the internal signal.

20. The input buffer of claim 17, wherein the input stage comprises a tristate circuit comprising:

a first P-channel transistor and a second P-channel transistor connected in series between a power supply terminal and the output of the input stage, the gate of the first P-channel transistor connected to receive the enable signal and the gate of the second P-channel transistor connected to receive the external input signal;

a first N-channel transistor and a second N-channel transistor connected in series between the output of the input stage and a reference voltage terminal, the gate of the first N-channel transistor connected to receive the external input signal, and the gate of the second N-channel transistor connected to receive the complement of the enable signal.

21. The input buffer of claim 17, wherein the driver circuit comprises an unbalanced inverter.

22. The input buffer of claim 17 wherein the driver circuit comprises a P-channel transistor having a first width and an N-channel transistor having a second width, and wherein the first width is significantly greater than two times the second width.

23. The driver circuit of claim 22, wherein the first width is about 20 times the second width.

24. The input buffer of claim 17, wherein the driver circuit comprises an inverter.

25. The input buffer of claim 24, wherein the driver circuit further comprises a transistor having its source-drain path connected between the output of the driver circuit and a reference terminal and its gate coupled to the output signal generated by the delay circuit.

26. The input buffer of claim 24, further comprising a circuit connected between a power supply terminal and the input of the driver circuit, the circuit placing a high voltage on the input of the driver circuit responsive to the output signal generated by the delay circuit.

27. The input buffer of claim 17, wherein the delay circuit includes at least one adjustment mechanism to adjust the delay associated with the delay circuit.

28. The input buffer of claim 27, wherein the adjustment mechanism comprises metal level switches.

29. The input buffer of claim 27, wherein the adjustment mechanism comprises an adjustable resistor capacitor (RC) delay circuit.

30. The input buffer of claim 29, wherein the adjustable resistor capacitor (RC) delay circuit includes a chain of inverters.

31. The input buffer of claim 17, wherein the input buffer is a clock buffer of a synchronous dynamic random access memory (SDRAM) device.

32. A method of buffering an external input signal comprising:

sensing the rising edge of an external input signal at an input circuit;

generating a rising edge of an internal signal at an output of a driver circuit in response to the rising edge of the external input signal;

disabling the input circuit in response to the rising edge of the internal signal;

applying the rising edge of the internal signal to a delay circuit and generating a delay output signal in response thereto;

applying the delay output signal to the driver circuit; and generating a falling edge of the internal signal in response to the delay output signal.

33. The method of claim 32, wherein the delay output signal has the opposite phase to the internal signal.

34. The method of claim 32, wherein the input circuit is a tristate buffer that is tristated in response to the rising edge of the internal signal.

35. The method of claim 32, wherein the rising edge of the internal signal is generated by an inverter.

36. The method of claim 35, wherein the falling edge of the internal signal is also generated by the inverter.

37. The method of claim 35, wherein the inverter in unbalanced.

38. The method of claim 37, wherein the inverter comprises a P-channel transistor and an N-channel transistor, the width of the P-channel transistor being significantly greater than twice the width of the N-channel transistor.

39. The method of claim 32, wherein the step of generating a delay output signal in response to the rising edge of the internal signal comprises applying the internal signal to a chain of inverters.

40. The method of claim 39, wherein the chain of inverters includes at least one capacitor connected at a node between the output of one inverter and the input of another inverter.

* * * * *